United States Patent
Son

(10) Patent No.: US 10,621,036 B2
(45) Date of Patent: Apr. 14, 2020

(54) MEMORY SYSTEM AND OPERATION METHOD THEREOF

(71) Applicant: SK hynix Inc., Icheon-si (KR)

(72) Inventor: Ik Joon Son, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 38 days.

(21) Appl. No.: 15/893,512

(22) Filed: Feb. 9, 2018

(65) Prior Publication Data

US 2019/0121695 A1 Apr. 25, 2019

(30) Foreign Application Priority Data

Oct. 19, 2017 (KR) ........................ 10-2017-0135896

(51) Int. Cl.
| | | |
|---|---|---|
| *G11C 29/00* | (2006.01) | |
| *G06F 11/10* | (2006.01) | |
| *G11C 29/52* | (2006.01) | |
| *G06F 3/06* | (2006.01) | |
| *G11C 29/04* | (2006.01) | |

(52) U.S. Cl.
CPC ........ *G06F 11/1068* (2013.01); *G06F 3/0614* (2013.01); *G06F 3/0659* (2013.01); *G06F 3/0673* (2013.01); *G06F 11/1008* (2013.01); *G11C 29/52* (2013.01); *G11C 2029/0411* (2013.01)

(58) Field of Classification Search
CPC .. G06F 11/1068; G06F 3/0614; G06F 3/0659; G06F 3/0673; G06F 13/1694; G06F 11/108; G06F 11/1076; G06F 2211/109; G06F 3/0689; G06F 3/061; G06F 3/064; G06F 3/0688; G06F 12/0246; G06F 3/0604; G06F 3/0619; G06F 3/0629; G06F 3/0679; G06F 12/0802; H01L 2224/16145; H01L 2224/16225; H01L 2224/48091; H01L 2924/00014; H03M 13/05; G11C 29/52; G11C 7/10; G11C 11/4063; G11C 5/06; G11C 29/44; G11C 2029/0409; G11C 29/808; G11C 16/0483; G11C 16/14; G11C 29/4401; G11C 11/5628

See application file for complete search history.

(56) References Cited

U.S. PATENT DOCUMENTS

| | | | |
|---|---|---|---|
| 2006/0146612 A1* | 7/2006 | Lim ........................ | G11C 16/26 365/185.21 |
| 2013/0227346 A1* | 8/2013 | Lee ........................ | G06F 11/108 714/6.24 |

(Continued)

FOREIGN PATENT DOCUMENTS

| | | |
|---|---|---|
| KR | 10-2016-0097657 | 8/2016 |
| KR | 10-2017-0042433 | 4/2017 |

*Primary Examiner* — Guerrier Merant
(74) *Attorney, Agent, or Firm* — Perkins Coie LLP

(57) ABSTRACT

The technology disclosed in this patent document can be implemented in embodiments to provide a memory system capable of improving a read operation, using an error correction technique (e.g., chipkill) that recovers data in correcting a data failure including a multibit failure, and an operation method of the memory system. The disclosed read operations based on recovery can be used for retrieving data from a memory chip by reconstructing the same data from other memory chips without accessing the memory chip and can be applied in various memory systems.

18 Claims, 11 Drawing Sheets

(56) References Cited

U.S. PATENT DOCUMENTS

| | | | |
|---|---|---|---|
| 2013/0262920 A1* | 10/2013 | Jung | G06F 11/1076 714/6.22 |
| 2014/0192583 A1* | 7/2014 | Rajan | G11C 7/10 365/63 |
| 2016/0004612 A1* | 1/2016 | Karamcheti | G06F 12/0246 711/103 |
| 2016/0284414 A1* | 9/2016 | Lin | G06F 12/0246 |

\* cited by examiner

MEMORY SYSTEM AND OPERATION METHOD THEREOF

CROSS-REFERENCE TO RELATED APPLICATION

This patent document claims, under 35 U.S.C. § 119(a), the priority to and benefits of the Korean patent application number 10-2017-0135896 filed on Oct. 19, 2017, the entire disclosure of which is incorporated herein by reference.

BACKGROUND

The technology in this patent document relates to a memory system and an operation method thereof, and more particularly, to a memory system using an error correction technique that recovers data in correcting a data failure including a multibit failure and an operation method of the memory system.

DESCRIPTION OF RELATED ART

A memory system may include a memory device and a memory controller.

The memory device may store data or output the stored data. For example, the memory device may be configured as a volatile memory device in which stored data is extinguished when power supply is interrupted or turned off, or be configured as a nonvolatile memory device in which stored data is retained when power supply is interrupted or turned off.

The memory controller may control data communication between a host and the memory device.

The host may communicate with the memory device through the memory controller by using an interface protocol such as peripheral component interconnect-express (PCI-E), advanced technology attachment (ATA), serial ATA (SATA), parallel ATA (PATA), or serial attached SCSI (SAS). Interface protocols between the host and the memory system are not limited to the above-described examples, and may include various interface protocols, including, e.g., a universal serial bus (USB), a multi-media card (MMC), an enhanced small disk interface (ESDI), integrated drive electronics (IDE) or others.

SUMMARY

The technology disclosed in this patent document can be implemented in embodiments to provide a memory system capable of improving a read operation, using an error correction technique (e.g., chipkill) that recovers data in correcting a data failure including a multibit failure, and an operation method of the memory system. The disclosed read operations based on recovery can be used for retrieving data from a memory chip by reconstructing the same data from other memory chips and can be applied in various memory systems of multiple memory chips to achieve certain operating advantages, including improved data read speed, parallel operations in connection with a memory chip in various situations where a memory chip is occupied by another on-going operation or is inaccessible. The disclosed read operations based on recovery can be used for retrieving data from a memory chip without accessing the memory chip.

In one aspect, the disclosed technology can be implemented to provide a memory system including: memory chips including a plurality of pages in which data is stored; and a memory controller configured to store a parity for the pages included in the memory chips, if a read command for a selected memory chip among the memory chips is generated, read the pages of unselected memory chips among the memory chips, and obtain data of a page of the selected memory chip by performing an operation on the read data and the parity.

In another aspect, the disclosed technology can be implemented to provide a method for operating a memory system: generating a parity for each page group by performing an operation on data stored in pages of a plurality of memory chips; performing a read operation on pages of unselected memory chips among the memory chips; and obtaining data of a selected page of a selected memory chip by performing an operation on data read from the unselected memory chips and the parity.

In another aspect, the disclosed technology can be implemented to provide a method for operating a memory system: generating a parity for each group of pages included in first to ith memory chips; performing a first read operation on a first page included in the first memory chip in response to a first read command; performing an error correction code (ECC) operation of the first read operation; if the ECC operation fails, performing a recovery operation until the ECC operation passes; and if a second read command for a second page of the first memory chip is generated while the recovery operation is being performed, reading data of second pages of the other memory chips except the first memory chip, and performing a second read operation of obtaining data of the second page of the first memory chip by performing an operation on the read data and a parity corresponding to the second page.

In another aspect, the disclosed technology can be implemented to provide a memory system including: memory chips including a plurality of pages to store data; and a memory controller in communication with the memory chips to access the pages and configured to execute a read command for reading data from a selected memory chip among the memory chips by reconstructing the data on the selected memory chip from reading the pages of unselected memory chips among the memory chips without accessing the selected memory chip, and performing an operation on the read data of the pages of unselected memory chips and a parity for the pages included in the memory chips.

In another aspect, the disclosed technology can be implemented to provide a method for operating a memory system, including: performing a read operation on pages of unselected memory chips among the memory chips to reconstruct data of a selected memory chip among the memory chips without reading the selected memory chip; and reconstructing data of a selected page of the selected memory chip by performing an operation on data read from the unselected memory chips and a parity for the pages of the unselected memory chips and the selected memory chip.

In another aspect, the disclosed technology can be implemented to provide a method for operating a memory system, including: generating a parity for each of different groups of pages included in memory chips in the memory system; performing a first read operation on a first page included in a first memory chip in response to a first read command; performing an error correction code (ECC) operation of the first read operation; performing a data recovery operation until the ECC operation passes; and in response to a second read command for reading a second page of the first memory chip while the data recovery operation is being performed at the first memory chip, reading data of second pages of the other memory chips except the first memory chip, and reconstructing data of the second page of the first memory chip by performing an operation on the read data of second pages of the other memory chips except the first memory chip and a parity corresponding to the second page of the first memory chip.

In another aspect, the disclosed technology can be implemented to provide a memory system including: memory chips including a plurality of pages to store data; a memory controller in communication with the memory chips to access the pages; and memory for storing one or more instructions configured to be executed by the memory controller. The instructions include instructions for issuing a read command to a selected memory chip; instructions for determining whether there is an unexecuted command to be executed on the selected memory chip or a command being executed on the selected memory chip; and instructions for restoring data that would have been read out from the selected memory chip by performing a logic operation on data and a parity for the pages in different memory chips when there is an unexecuted command to be executed on the selected memory chip or a command being executed on the selected memory chip.

In yet another aspect, the disclosed technology can be implemented to provide a method for operating a memory system having a plurality of memory chips to carry out parallel operations in connection with the same memory chip. This method includes: performing a first operation on a first memory chip over a first operation period; and, during the first operation period while the first operation is in progress, performing a second operation for retrieving data from the first memory chip without directly performing a read operation on the first memory chip and without interrupting the first operation on the first memory chip that is in progress. The second operation for retrieving data from the first memory chip includes: reading out pages of other memory chips without reading the selected memory chip; and processing data read from the pages of the other memory chips and a parity for the pages of the other memory chips and the first memory chip to construct data in the first memory chip as retrieved data from the first memory chip.

The above and other aspects and their implementations are described in greater detail in the drawings, the description and the claims.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. The described embodiments may be modified in various different ways Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
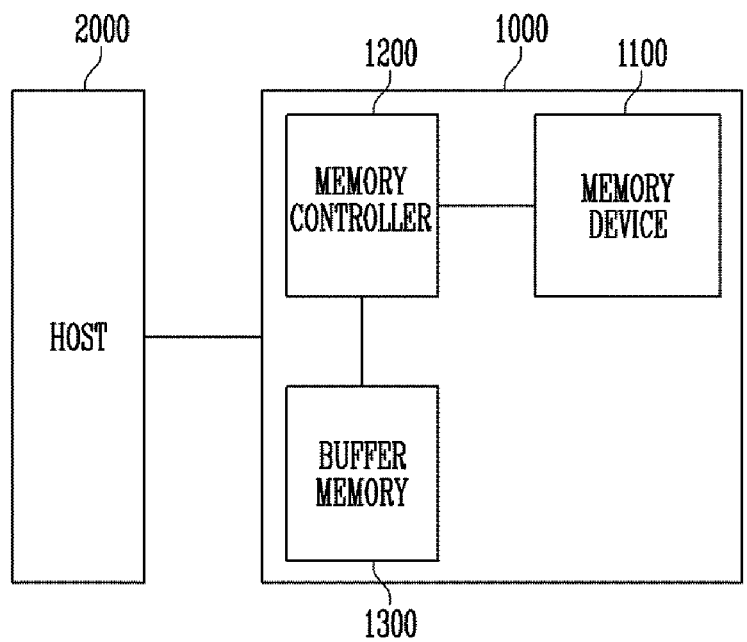
FIG. 1 is a diagram illustrating an example of a memory system according to an embodiment of the present disclosure.

FIG. 1 is a diagram illustrating an example of a memory system according to an embodiment of the present disclosure.

Referring to FIG. 1, the memory system 1000 may include a memory device 1100 for storing digital information or data, such as user data, a buffer memory 1300 for temporarily storing data, and a memory controller 1200 for controlling the memory device 1100 and the buffer memory 1300. The memory device 1100 is in communication with a host 2000 and can be operated under the control of the host 2000. The host 2000 can be a device or a system that includes one or more computer processors which operate to retrieve digital information or data from the memory device 1000 or store or write digital information or data into the memory device 1000. In various applications, the host 2000 can be in various forms, including, for example, a personal computer (PC), a portable digital device, a tablet PC, a digital camera, a digital audio player, a digital multimedia player, a television, a wireless communication device, a cellular phone, console video game hardware, or a digital set-top box. The memory device 1100 may be implemented with a nonvolatile memory device in which stored data is retained when power supply is interrupted or turned off. The buffer memory may be implemented by using a volatile memory device.

The host 2000 may communicate with the memory system 1000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), or others.

The memory controller 1200 may control overall operations of the memory system 1000, and control data exchange between the host 2000 and the memory device 1100. For example, the memory controller 1200 may program data in memory cells or read data stored in the memory cells by controlling the memory device 1100 according to a request of the host 2000. Also, the memory controller 1200 may store information of main memory blocks and sub-memory blocks, which are included in the memory device 1100, and control the memory device 1100 such that a program operation is performed on a main memory block or sub-memory block according to the amount of data loaded to perform the program operation. In some embodiments, the memory device 1100 may include a flash memory.

The memory controller 1200 may control data exchange between the host 2000 and the buffer memory 1300 or temporarily store system data for controlling the nonvolatile memory device 1100 in the buffer memory 1300. The buffer memory 1300 may be used as a working memory, a cache memory, or a buffer memory of the memory controller 1200. The buffer memory 1300 may store codes and commands, which are executed by the memory controller 1200. Also, the buffer memory 1300 may store data processed by the memory controller 1200.

The memory controller 1200 may temporarily store data input from the host 2000 in the buffer memory 1300 and then transmit the data temporarily stored in the buffer memory 1300 to the nonvolatile memory device 1100 to be stored in the nonvolatile memory device 1100. In certain operations, the memory controller 1200 may receive data and a logical address, which are input from the host 2000, and transform the logical address to a physical address indicating a region in which data is to be actually stored in the nonvolatile memory device 1100. The memory controller 1200 may store, in the buffer memory 1300, a logical-to-physical address mapping table that establishes a mapping relationship between the logical address and the physical address.

In some embodiments, the buffer memory 1300 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), etc. In other embodiments, the memory system 1000 may not include the buffer memory 1300.

Figure 2:
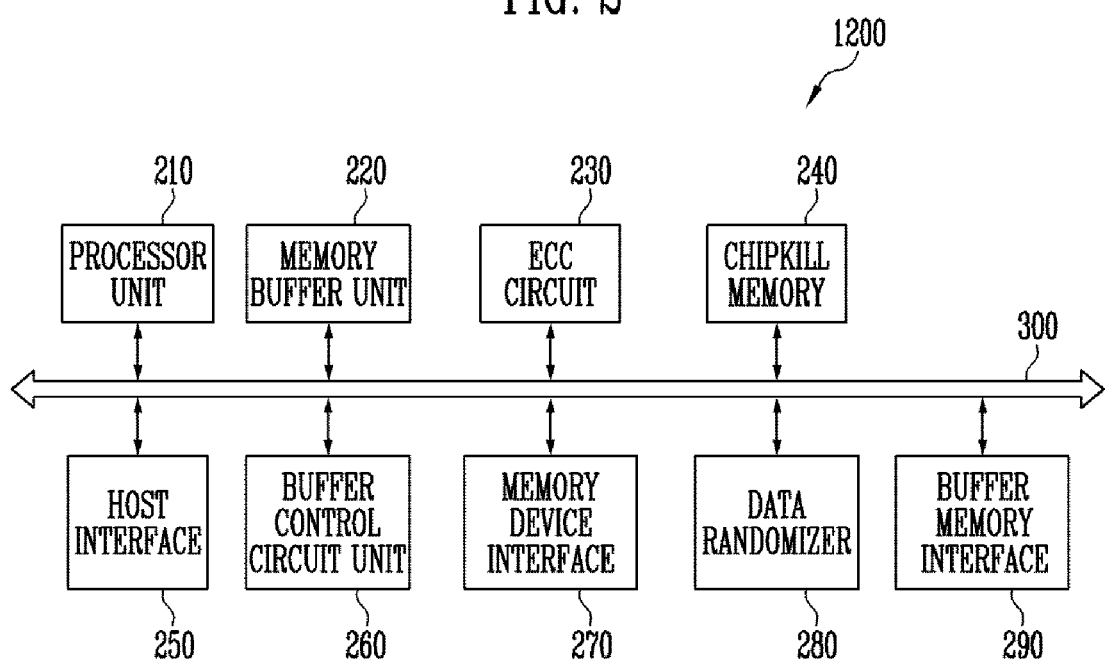
FIG. 2 is a diagram illustrating one example of a memory controller of FIG. 1.

FIG. 2 is a diagram illustrating one example of the memory controller of FIG. 1.

Referring to FIG. 2, the memory controller 1200 may include a processor unit 210, a memory buffer unit 220, an error correction code (ECC) circuit 230, a designated memory 240 that enables recovery such as a chipkill memory, a host interface 250, a buffer control circuit unit 260, a memory device interface 270, a data randomizer 280, a buffer memory interface 290, and a bus 300.

The bus 300 may be configured to provide channels between components of the memory controller 1200.

The processor unit 210 may control overall operations of the memory controller 1200, and perform a logical operation. The processor 210 may communicate with the external host 2000 through the host interface 250, and communicate with the memory device 1100 through the memory device interface 270. The processor 210 may communicate with the buffer memory 1300 through the buffer memory interface 290. Also, the processor unit 210 may control the memory buffer unit 220 through the buffer control circuit unit 260. The processor 210 may further control an operation of the memory system 1000 by using the memory buffer unit 220 as a working memory, a cache memory, or a buffer memory.

The processor unit 210 may queue a plurality of commands input from the host 2000. Such an operation is referred to as a multi-queue operation and can be handled by the processor unit 210 in different ways. The processor unit 210 may sequentially transfer a plurality of queued tags to the memory device 1100. In implementations, for example, if a second read command is received after a first read command is output, the processor unit 210 may hold off the execution of the second read command to until a read operation corresponding to the first read command is ended. Alternatively, in other implementations, when an error discovery operation is performed in the read operation corresponding to the first read command, the processor unit 210 may perform a read operation corresponding to the second read command by using the chipkill memory 240 while the recovery operation or error correction operation is being performed.

The memory buffer unit 220 may be used as the working memory, the cache memory, or the buffer memory of the processor unit 210. The memory buffer unit 220 may store codes and commands, which are executed by the processor unit 210. The memory buffer unit 220 may include a static RAM (SRAM) or a dynamic RAM (DRAM).

The ECC circuit 230 may perform an ECC operation. The ECC circuit 230 may perform ECC encoding on data to be written in the memory device 1100 through the memory device interface 270. The ECC encoded data may be transferred to the memory device 1100 through the memory device interface 270. The ECC circuit 230 may perform ECC decoding on data received from the memory device 1100 through the memory device interface 270. In some implementations, for example, the ECC circuit 230 may be included as a component of the memory device interface 270 in the memory device interface 270.

The memory 240 that enables recovery such as a chipkill memory may store a parity for performing recovery when a data error occurs such as the known chipkill technique, the detail of which is omitted in this patent document. The chipkill technique is used to recover an error when the error occurs in a specific memory chip. The chipkill technique reads data from other unselected memory chips, and performs an operation on the read data and a parity to recover the data of the selected memory chip that suffers from the error. The parity is generated by performing an operation on data of different memory chips and is stored, and, if an error occurs in a selected memory chip, data of the selected memory chip can be recovered by performing an operation on the data of the other memory chips except the selected memory chip and the parity. Here, one memory chip may indicate one memory device. In this embodiment shown in FIG. 8, the disclosed read operations based on recovery (e.g., the chipkill technique) is applied to not only the ECC operation but also a general read operation, so that the time required to perform a read operation can be reduced with or without a failure in passing the ECC operation.

For example, when a read operation is to be performed by another read command in the performance of an operation such as a recovery operation, which has a long operation time in a specific memory chip and thus occupies the specific memory chip for the duration of the recovery operation. The disclosed read operations based on recovery (e.g., the chipkill) can be used to execute the other read command so that data of a selected memory can be rapidly obtained from other memory chips while the recovery operation is being performed at the specific memory chip. In executing the other reading command to retrieve data from the selected memory chip, the selected memory chip is not accessed and, instead, other non-selected memory chips are accessed.

For another example, when soft decoding is required in a read operation of a specific memory chip so that the specific memory chip is temporarily not available for performing another read operation, the disclosed read operations based on recovery (e.g., the chipkill) can be used so that data of the selected memory chip can be rapidly obtained from other memory chips without directly accessing the selected memory chip.

In some embodiments for implementing the disclosed read operations based on recovery, the memory controller 1200 may not include the chipkill memory 240 for storing the parity information. In implementations where the chipkill memory 240 is not included in the memory controller 1200, the read operation based on recovery can still be implemented by storing the parity information in any one memory device 1100 among memory devices 1100.

The host interface 250 is configured to communicate with the external host 2000 under the control of the processor unit 210. The host interface 250 may be configured to communicate with the host 2000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), or a load reduced DIMM (LRDIMM).

The buffer control circuit unit 260 is configured to control the memory buffer unit 220 under the control of the processor unit 210.

The memory device interface 270 is configured to communicate with the memory device 1100 under the control of the processor unit 210. The memory device interface 270 may communicate a command, an address, and data with the memory device 1100 through a channel.

For example, in some implementations, the memory controller 1200 may not include the memory buffer unit 220 and the buffer control circuit unit 260.

For example, the processor unit 210 may control an operation of the memory controller 1200 by using codes. The processor unit 210 may load codes from a nonvolatile memory device (e.g., a read only memory (ROM)) provided inside the memory controller 1200. As another example, the processor unit 210 may load codes from the memory device 1100 through the memory device interface 270.

The data randomizer 280 may randomize data or de-randomize the randomized data. The data randomizer 280 may perform a data randomizing operation on data to be written in the memory device 1100 through the memory device interface 270. The randomized data may be transferred to the memory device 1100 through the memory device interface 270. The data randomizer 280 may perform a data de-randomizing operation on data received from the memory device 1100 through the memory device interface 270. As an example, the data randomizer 280 may be included as a component of the memory device interface 270 in the memory device interface 270.

For example, the bus 300 of the memory controller 1200 may be divided into a control bus and a data bus. The data bus may be configured to transmit data in the memory controller 1200, and the control bus may be configured to transmit control information such as a command and an address in the memory controller 1200. The data bus and the control bus are separated from each other, and may not interfere or influence with each other. The data bus may be coupled to the host interface 250, the buffer control circuit unit 260, the ECC circuit 230, the memory device interface 270, and the buffer memory interface 290. The control bus may be coupled to the host interface 250, the processor unit 210, the buffer control circuit unit 260, the memory device interface 270, and the buffer memory interface 290.

The buffer memory interface 290 may be configured to communicate with the buffer memory 1300 under the control of the processor unit 210. The buffer memory interface 290 may communicate a command, an address, and data with the buffer memory 1300 through a channel. For example, the memory controller 1200 may not include the buffer memory interface 290.

Figure 3:
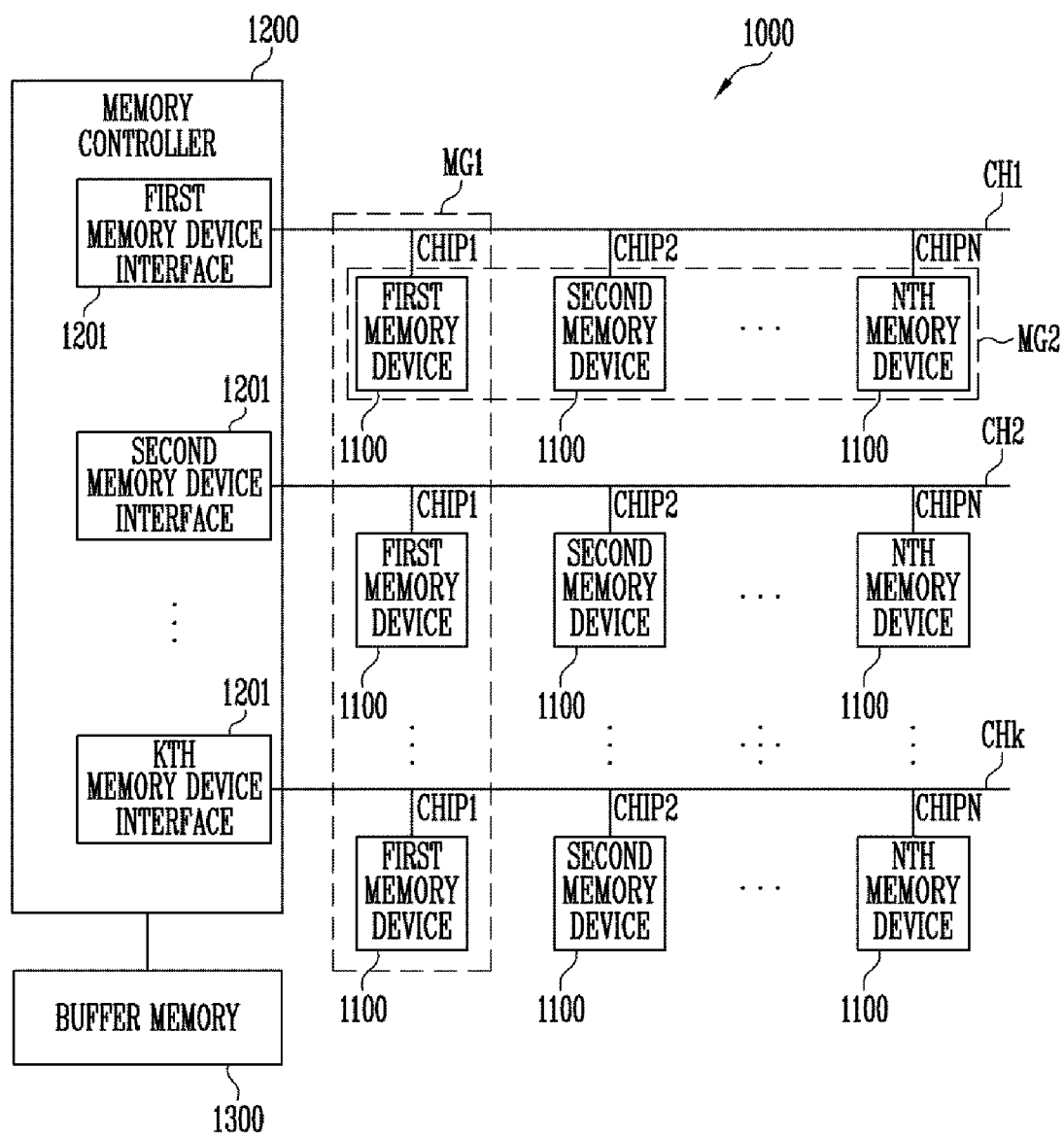
FIG. 3 is a diagram illustrating an example of a memory system according to another embodiment of the present disclosure.

FIG. 3 is a diagram illustrating an example of a memory system 1000 according to another embodiment of the present disclosure. FIG. 3 illustrates a memory system 1000 including a plurality of memory devices 110 coupled to a memory controller 1200 through a plurality of channels CH1 to CHk.

Referring to FIG. 3, the memory controller 1200 may communicate with the plurality of memory devices 1100 through the plurality of channels CH1 to CHk. The memory controller 1200 may include a plurality of memory device interfaces 1201, and each of the plurality of channels CH1 to CHk may be coupled to any one of the plurality of memory device interfaces 1201. For example, a first channel CH1 may be coupled to a first memory device interface 1201, a second channel CH2 may be coupled to a second memory device interface 1201, and a kth channel CHk may be coupled to a kth memory device interface 1201. Each of the plurality of channels CH1 to CHk may be coupled to one or more memory devices 1100. In addition, memory devices 1100 coupled to different channels may operate independently from each other. For example, memory devices coupled to different channels CH1 to CHk may be defined as a first memory group MG1, and memory devices coupled to the same channel CH1 may be defined as a second memory group MG2. Since the memory devices included in the first memory group MG1 are coupled to the different channels CH1 to CHk, the memory devices included in the first memory group MG1 may operate at the same time. Since the memory devices included in the second memory group MG2 are coupled to the same channel (any one of CH1 to CHk), the memory devices included in the second memory group MG2 may operate at different times.

The memory devices 1100 coupled to one channel may constitute different memory chips CHIP1 to CHIPN. For example, if N memory devices 1100 are coupled to one channel, the memory devices 1100 may constitute different memory chips CHIP1 to CHIPN.

Since first to Nth memory chips CHIP1 to CHIPN coupled to the first channel CH1 share the first channel CH1, the first to Nth memory chips CHIP1 to CHIPN cannot simultaneously communicate data or commands with the memory controller 1200 through the first channel CH1 but sequentially communicate the data or commands with the memory controller 1200 through the first channel CH1. That is, while the memory controller 1200 is transmitting data to the first memory chip CHIP1 of the first channel CH1, the second to Nth memory chips CHIP2 to CHIPN coupled to the first channel CH1 cannot communicate data or commands with the memory controller 1200. In other words, while any one among the first to Nth memory chips CHIP1 to CHIPN sharing the first channel CH1 is occupying the first channel CH1, the other memory devices 1100 coupled to the first channel CH1 cannot occupy the first channel CH1.

The first memory chip CHIP1 of the first channel CH1 and the first memory chip CHIP1 of the second channel CH2 may communicate independently from each other. In other words, at the same time when the memory controller 1200 communicates data with the first memory device 1100 constituting the first memory chip CHIP1 of the first channel CH1 through the first channel CH1 and the first memory device interface 1201, the memory controller 1200 may communicate data with the first memory device 1100 of the second channel CH2 through the second channel CH2 and the second memory device interface 1201.

The memory system 1000 may include a buffer memory 1300 coupled to the memory controller 1200. As another example, the memory system 1000 may not include the buffer memory 1300.

Figure 4:
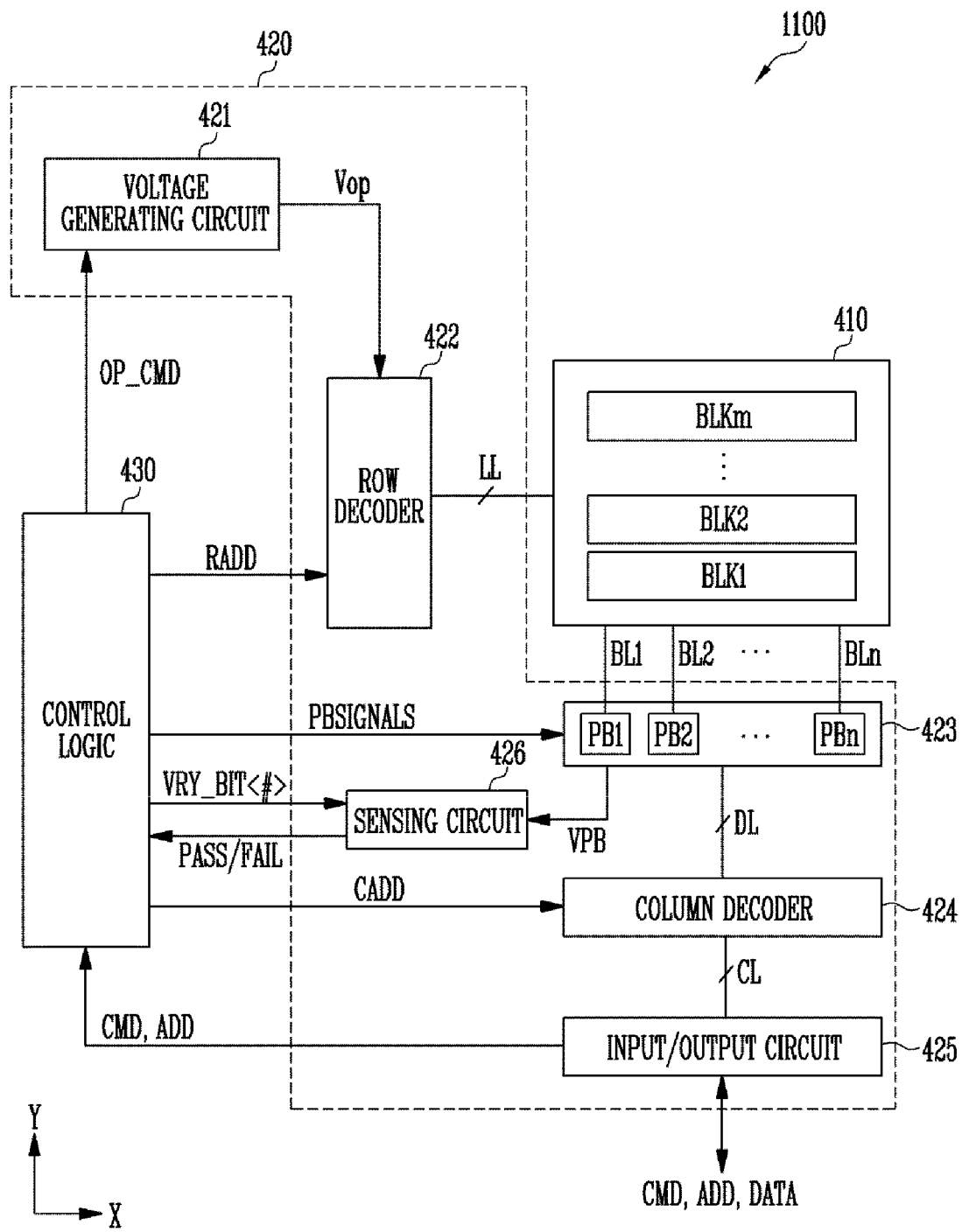
FIG. 4 is a diagram illustrating an example of a memory device.

FIG. 4 is a diagram illustrating an example of a memory device which may constitute a memory chip of multiple memory chips in a system.

Referring to FIG. 4, the memory device 1100 may include a memory cell array 410 that stores data. The memory device 1100 may include peripheral circuits 420 configured to perform a program operation for storing data in the memory cell array 410, a read operation for outputting the stored data, and an erase operation for erasing the stored data. The memory device 1100 may include a control logic 430 that controls the peripheral circuits 420 under the control of the memory controller (1200 of FIG. 1).

The memory cell array 410 may include a plurality of memory blocks BLK1 to BLKm (m is a positive integer). Local lines LL and bit lines BL1 to BLn (n is a positive integer) may be coupled to the memory blocks BLK1 to BLKm. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks BLK1 to BLKm, respectively, and the bit lines BL1 to BLn may be commonly coupled to the memory blocks BLK1 to BLKm. The memory blocks BLK1 to BLKm may be implemented in a two-dimensional or three-dimensional structure. For example, memory cells may be arranged in a direction parallel to a substrate in memory blocks BLK1 to BLKm having a two-dimensional structure. For example, memory cells may be arranged in a direction vertical to a substrate in memory blocks BLK1 to BLKm having a three-dimensional structure.

The peripheral circuits 420 may be configured to perform program, read, and erase operations of a selected memory block (any one of BLK1 to BLKm) under the control of the control logic 430. For example, the peripheral circuits 420, under the control of the control logic 430, may supply verify and pass voltages to the first select line, the second select line, and the word lines, selectively discharge the first select line, the second select line, and the word lines, and verify memory cells coupled a selected word line among the word lines. For example, the peripheral circuits 420 may include a voltage generating circuit 421, a row decoder 422, a page buffer group 423, a column decoder 424, an input/output circuit 425, and a sensing circuit 426.

The voltage generating circuit 421 may generate various operating voltages Vop used for program, read, and erase operations in response to an operation signal OP_CMD. Also, the voltage generating circuit 421 may selectively discharge the local lines LL in response to the operation signal OP_CMD. For example, the voltage generating circuit 421 may generate a program voltage, a verify voltage, pass voltages, a turn-on voltage, a read voltage, an erase voltage, a source line voltage, and the like under the control of the control logic 430.

The row decoder 422 may transfer the operating voltages Vop to local lines LL coupled to a selected memory block (any one of BLK1 to BLKm) in response to a row address RADD.

The page buffer group 423 may include a plurality of page buffers PB1 to PBn coupled to the bit lines BL1 to BLn. The page buffers PB1 to PBn may operate in response to page buffer control signals PBSIGNALS. For example, the page buffers PB1 to PBn may temporarily store data received through the bit lines BL1 to BLn, or sense voltages or current of the bit lines BL1 to BLn in a read or verify operation.

The column decoder 424 may transfer data between the input/output circuit 425 and the page buffer group 423 in response to a column address CADD. For example, the column decoder 424 may exchange data with the page buffers PB1 to PBn through data lines DL, or exchange data with the input/output circuit 425 through column lines CL.

The input/output circuit 425 may transfer a command CMD and address ADD, which are received from the memory controller (1200 of FIG. 1), to the control logic 430, or exchange data with the column decoder 424.

The sensing circuit 426, in a read operation and a verify operation, may generate a reference current in response to a permission bit VRY_BIT<#>, and output a pass signal PASS or a fail signal FAIL by comparing a sensing voltage VPB received from the page buffer group 423 with a reference voltage generated by the reference current.

The control logic 430 may control the peripheral circuits 420 by outputting the operation signal OP_CMD, the row address RADD, the page buffer control signals PBSIGNALS, and the permission bit VRY_BIT<#> in response to the command CMD and the address ADD. Also, the control logic 430 may determine whether the verify operation has passed or failed in response to the pass or fail signal PASS or FAIL.

The memory blocks BLK1 to BLKm may be units of an erase operation. For example, a plurality of memory cells included in one memory block are simultaneously erased, and may not be selectively erased.

Figure 5:
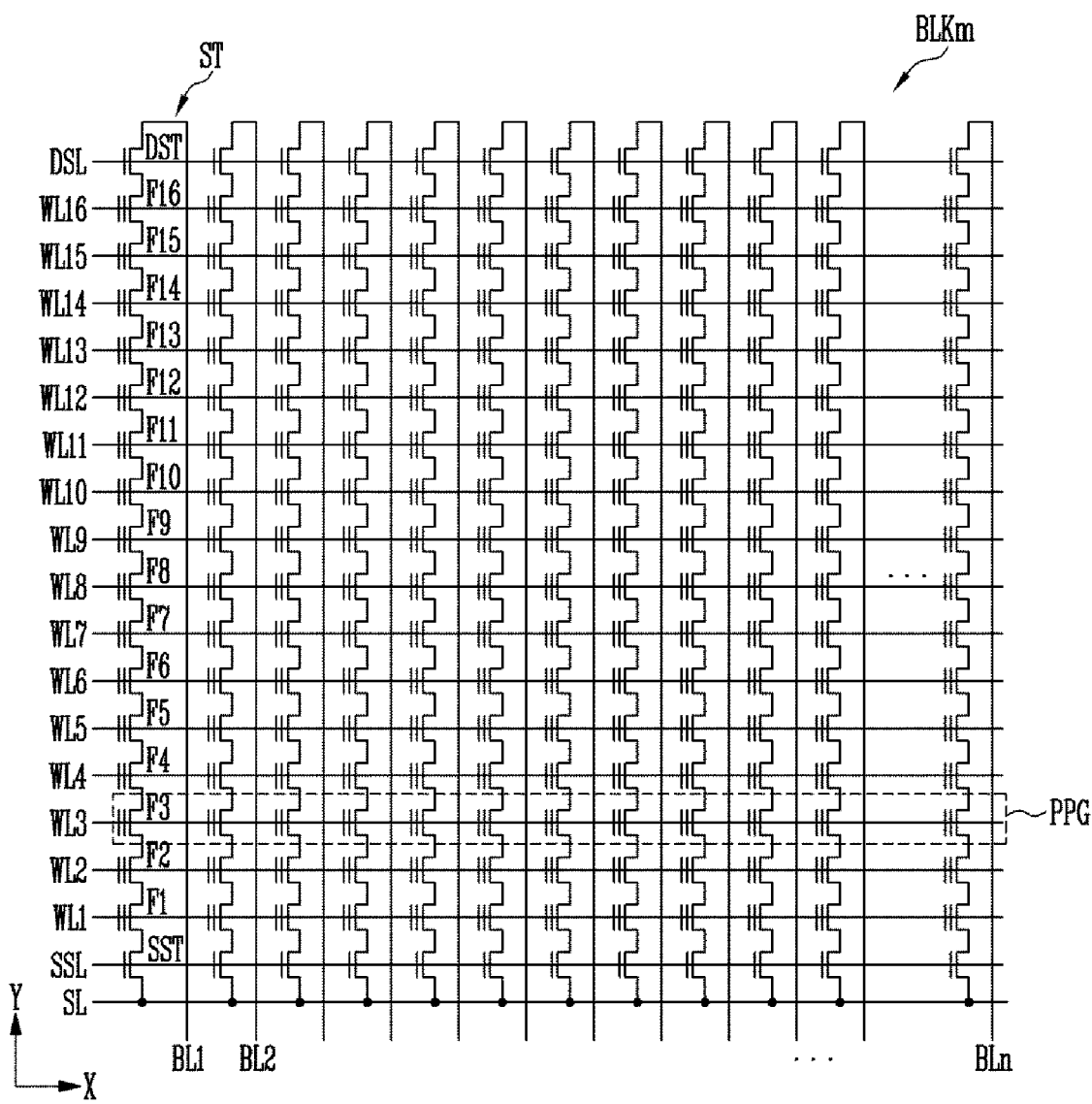
FIG. 5 is a diagram illustrating an example of a memory block.

FIG. 5 is a diagram illustrating an example of a memory block.

Referring to FIG. 5, in the memory block BLKm, a plurality of word lines arranged in parallel to one another may be coupled between a first select line and a second select line. Here, the first select line may be a source select line SSL, and the second select line may be a drain select line DSL. More specifically, the memory block BLKm may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and memory cells of which number is larger than that of the memory cells F1 to F16 shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG Therefore, physical pages PPG of which number corresponds to that of the word lines WL1 to WL16 may be included in the memory block BLKm.

In implementations, a memory cell may be structured to store data of one bit. Such a one-bit cell may be referred to as a single level cell (SLC). Under the SLC design, one physical page PPG may store one logical page (LPG) data. The one LPG data may include data bits of which number corresponds to that of cells included in one physical page PPG Alternatively, one memory cell may be structured to store data of two or more bits. Such a cell may be referred to as a multi-level cell (MLC). Under the MLC design, one physical page PPG may store two or more LPG data.

A plurality of memory cells included in one physical page PPG may be simultaneously programmed such that the memory device 1100 may perform a program operation in units of physical pages PPG Similarly, a plurality of memory cells included in one memory block may be simultaneously erased such that the memory device 1100 may perform an erase operation in units of physical pages PPG The memory block BLKm may be called as an erase unit block. In one example of operation, in order to update a portion of data stored in one memory block BLKm, after the portion of the data, which is to be updated, is changed by reading the entire data stored in the corresponding memory block BLKm, the entire data may be again programmed in another memory block BLKm. This is because, when the memory block BLKm is a unit of an erase operation in the operation of the memory device 1100, new data cannot be again programmed in an erased portion of data stored in the memory block BLKm.

Figure 6:
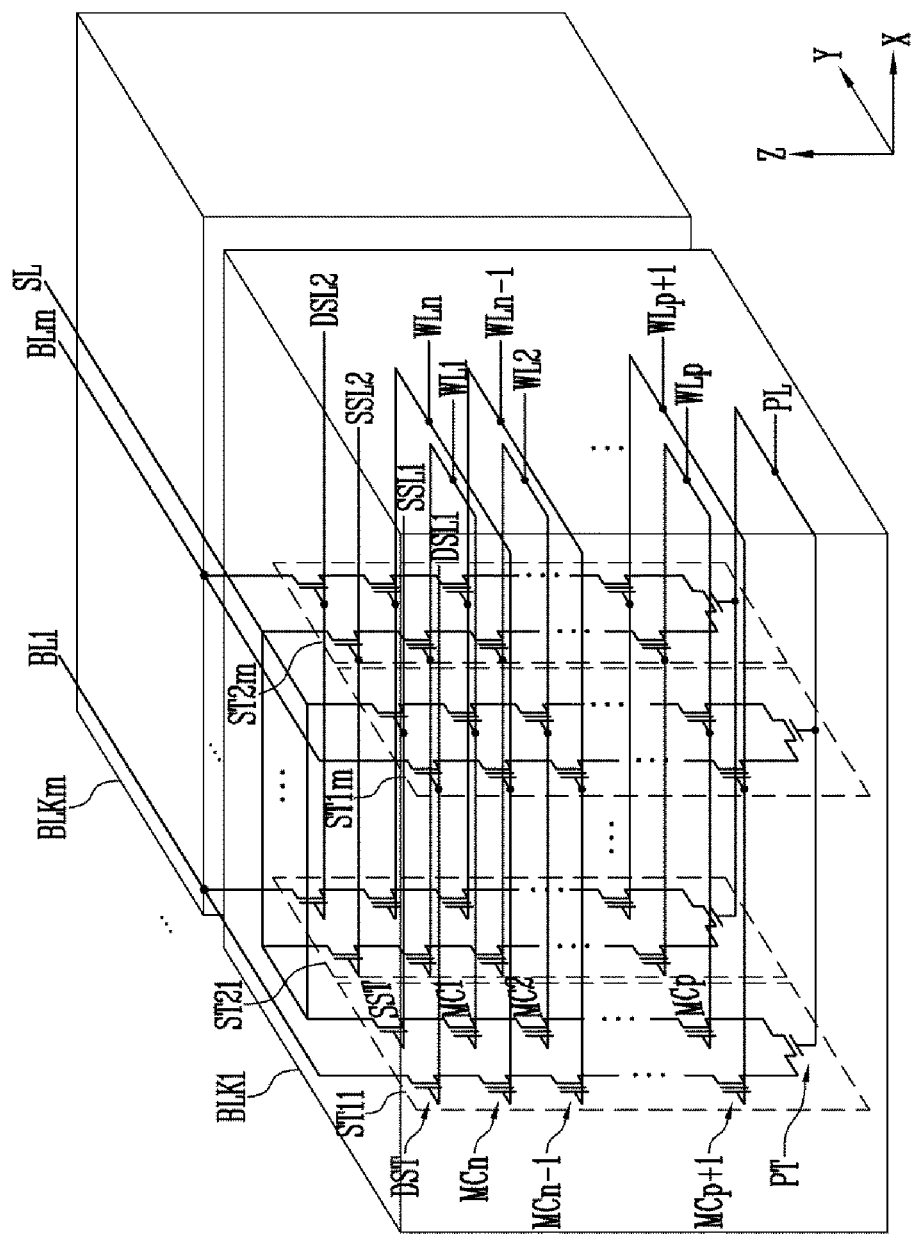
FIG. 6 is a diagram illustrating an example of an embodiment of a three-dimensionally configured memory block.

FIG. 6 is a diagram illustrating an example of an embodiment of a three-dimensionally configured memory block.

Referring to FIG. 6, the memory cell array 410 may include a plurality of memory blocks BLK1 to BLKm. A first memory block BLK1 will be described as an example. The first memory block BLK1 may include a plurality of strings ST11 to ST1m and ST21 to ST2m. In an embodiment, each of the plurality of strings ST11 to ST1m and ST21 to ST2m may be formed in a 'U' shape. In the first memory block BLK1, m strings may be arranged in a row direction (X direction). FIG. 6 illustrates an example in which two strings are arranged in a column direction (Y direction). In implementations, other arrangements are possible. For example, three or more strings may be arranged in the column direction (Y direction).

In the illustrated example in FIG. 6, each of the plurality of strings ST11 to ST1m and ST21 to ST2m may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 6, source select transistors of strings ST11 to ST1m of a first row may be coupled to a first source select line SSL1. Source select transistors of strings ST21 to ST2m of a second row may be coupled to a second source select line SSL2.

In another embodiment, the source select transistors of the strings ST11 to ST1m and ST21 to ST2m may be commonly coupled to one source select line.

In the example in FIG. 6, the first to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 6, strings ST11 and ST21 of a first column may be coupled to a first bit line BL1. Strings ST1m and ST2m of an mth column may be coupled to an nth bit line BLn.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. As any one of the drain select lines DSL1 and DSL2 is selected, strings arranged in one row direction may be selected. As any one of the word lines WL1 to WLn is selected, one page among the selected strings may be selected.

Figure 7:
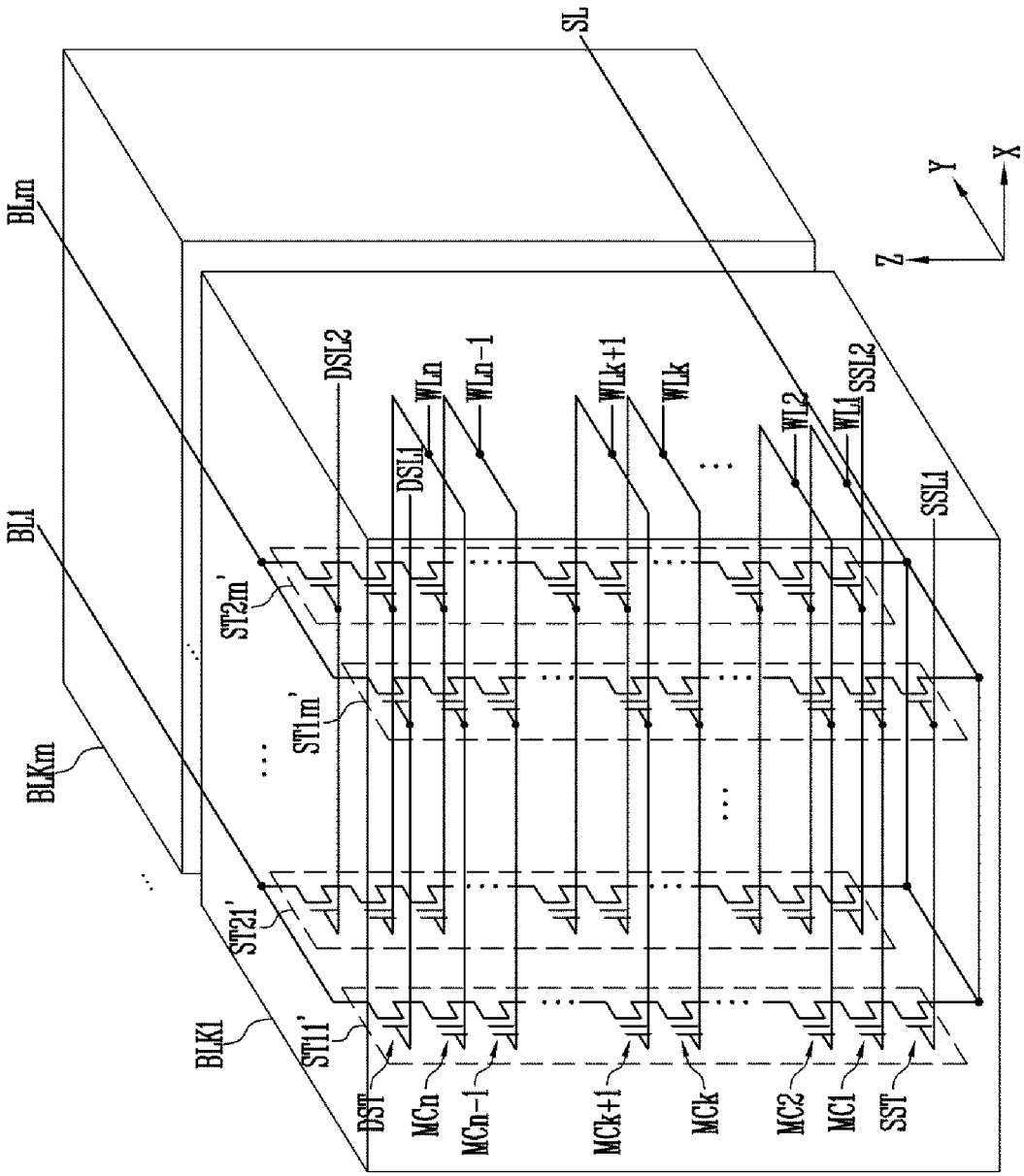
FIG. 7 is a diagram illustrating an example of another embodiment of the three-dimensionally configured memory block.

FIG. 7 is a diagram illustrating an example of another embodiment of the three-dimensionally configured memory block.

Referring to FIG. 7, the memory cell array 410 may include a plurality of memory blocks BLK1 to BLKm. A first memory block BLK1 will be described as an example. The first memory block BLK1 may include a plurality of strings ST11' to ST1m' and ST21' to ST2m'. Each of the plurality of strings ST11' to ST1m' and ST21' to ST2m' may extend along a vertical direction (Z direction). In the memory block 110, m strings may be arranged in a row direction (X direction). In FIG. 7, it is illustrated that two strings are arranged in a column direction (Y direction). However, this is for convenience of description, and three or more strings may be arranged in the column direction (Y direction).

In the example in FIG. 7, each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In another embodiment, the source select transistors of the strings ST11' to ST1m' and ST21' to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell that does not store data and provide circuitry operation to facilitate or improve the operation or performance of a memory cell that stores data. In the illustrated example where a dummy memory cell is provided, the voltage or current of a corresponding string can be stably controlled. Accordingly, the reliability of data stored in the first memory block BLK1 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

That is, the first memory block BLK1 of FIG. 7 may have an equivalent circuit similar to that of the first memory block BLK1 of FIG. 6, except that the pipe transistor PT is excluded from each string.

Figure 8:
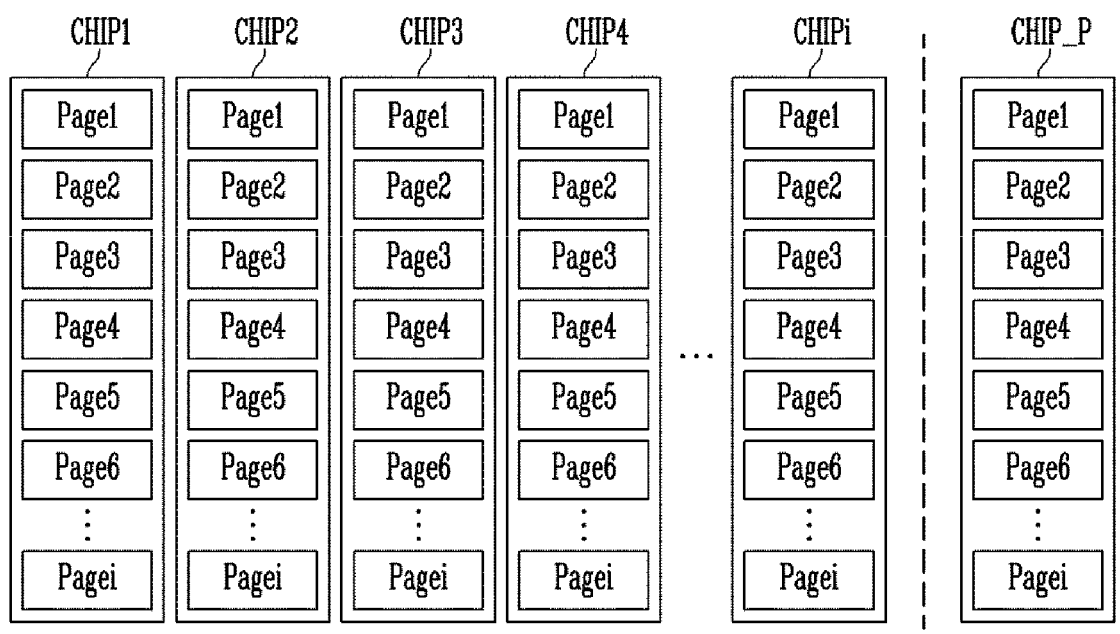
FIG. 8 is a diagram illustrating an example of chipkill techniquerecoveryrecovery.

FIG. 8 is a diagram illustrating an example of a memory system having different memory chips to include a recovery mechanism for recovery to correct data errors and for faster read operations based on storing parity information in a designated memory such as a chipkill memory or in the memory chips.

Referring to FIG. 8, when an error occurs during a read operation of a selected memory chip, the data may be recovered by performing a recovery operation. However, a parity for a plurality of memory chips may be generated to prepare for data read or recovery where the data cannot be recovered by performing the recovery operation, and be stored in a designed memory 240 such as the chipkill memory 240 of FIG. 2. Alternatively, in a system where a chipkill memory is not implemented, the parity may be stored in any one memory chip among memory chips.

In the example in FIG. 8, the first to ith memory chips CHIP1 to CHIPi shown are memory chips coupled to different channels, and may be chips included in the first memory group MG1 of FIG. 3. In some implementations, for example, the first memory chip CHIP1 of FIG. 8 may be a chip coupled to a first channel, the second memory chip CHIP2 of FIG. 8 may be a chip coupled to a second channel, and the ith memory chip CHIPi may be a chip coupled to an ith channel. A Pth memory chip CHIP_P may be the chipkill memory 240 of FIG. 2 included in the memory controller 1200 of FIG. 2.

In the example in FIG. 8, the first to ith memory chips CHIP1 to CHIPi may include a plurality of memory blocks, and each of the memory blocks may include a plurality of pages Page1 to Pagei. The Pth memory chip CHIP_P may be configured differently from the first to ith memory chips CHIP1 to CHIPi. However, the Pth memory chip CHIP_P may include at least pages corresponding to the number of pages of each memory block.

The pages Page1 to Pagei shown in FIG. 8 may be pages included in any one memory block among the memory blocks included in each memory chip.

The parity information for recovery can be implemented in different ways. For example, FIG. 8 shows a designated CHIP_P with pages 1 through i is used for storing the parity information. Specifically, a parity for the first pages Page1 of the first to ith memory chips CHIP1 to CHIPi may be stored in a first page Page1 of the Pth memory chip CHIP_P, a parity for the second pages Page2 of the first to ith memory chips CHIP1 to CHIPi may be stored in a second page Page2 of the Pth memory chip CHIP_P and so on. In this manner, a parity for the ith pages Pagei of the first to ith memory chips CHIP1 to CHIPi may be stored in an ith page Pagei of the Pth memory chip CHIP_P. Here, the number of memory chips and the number of pages may be different from each other. Accordingly, a parity of a group of the first pages Page1 included in different memory chips may be stored in the first page Page1 of the Pth memory chip CHIP_P, and a parity for a group of the ith pages Pagei included in different memory chips may be stored in the ith page Pagei of the Pth memory chip CHIP_P. In other words, parities may be generated in units of groups of pages included in memory chips.

The parities stored in the first to ith pages Page1 to Pagei of the Pth memory chip CHIP_P may be changed depending on data stored in the first to ith pages Page1 to Pagei of the first to ith memory chips CHIP1 to CHIPi. For example, when data is programmed in only the first page Page1 of the first memory chip CHIP1 among the first to ith memory chips CHIP1 to CHIPi, a parity for the first page Page1 of the first memory chip CHIP1 may be stored in the first page Page1 of the Pth memory chip CHIP_P. When data is programmed in only the first pages Page1 of the first and second memory chips CHIP1 and CHIP2 among the first to ith memory chips CHIP1 to CHIPi, a result value obtained by performing an XOR operation on the data of the first pages Page1 of the first and second memory chips CHIP1 and CHIP2 may be stored as a parity in the first page Page1 of the Pth memory chip CHIP_P. For example, when data is programmed in the first pages Page1 of the first to ith memory chips CHIP1 to CHIPi, a result value obtained by performing an XOR operation on the data of the first pages Page1 of the first to ith memory chips CHIP1 to CHIPi may be stored in the first page Page1 of the Pth memory chip CHIP_P. Therefore, in order to read data stored in a selected page of a selected memory chip among the first to ith memory chips CHIP1 to CHIPi, an XOR operation may be performed on a parity for a page corresponding to a selected page among the first to ith pages Page1 to Pagei of the Pth memory chip CHIP_P and data stored in pages of unselected memory chips. The XOR operation may be performed by the processor unit 210 of FIG. 2 of the memory controller.

An operation method of the memory system based on the above-described read operations based on recovery (e.g., chipkill) is described below.

Figure 9:
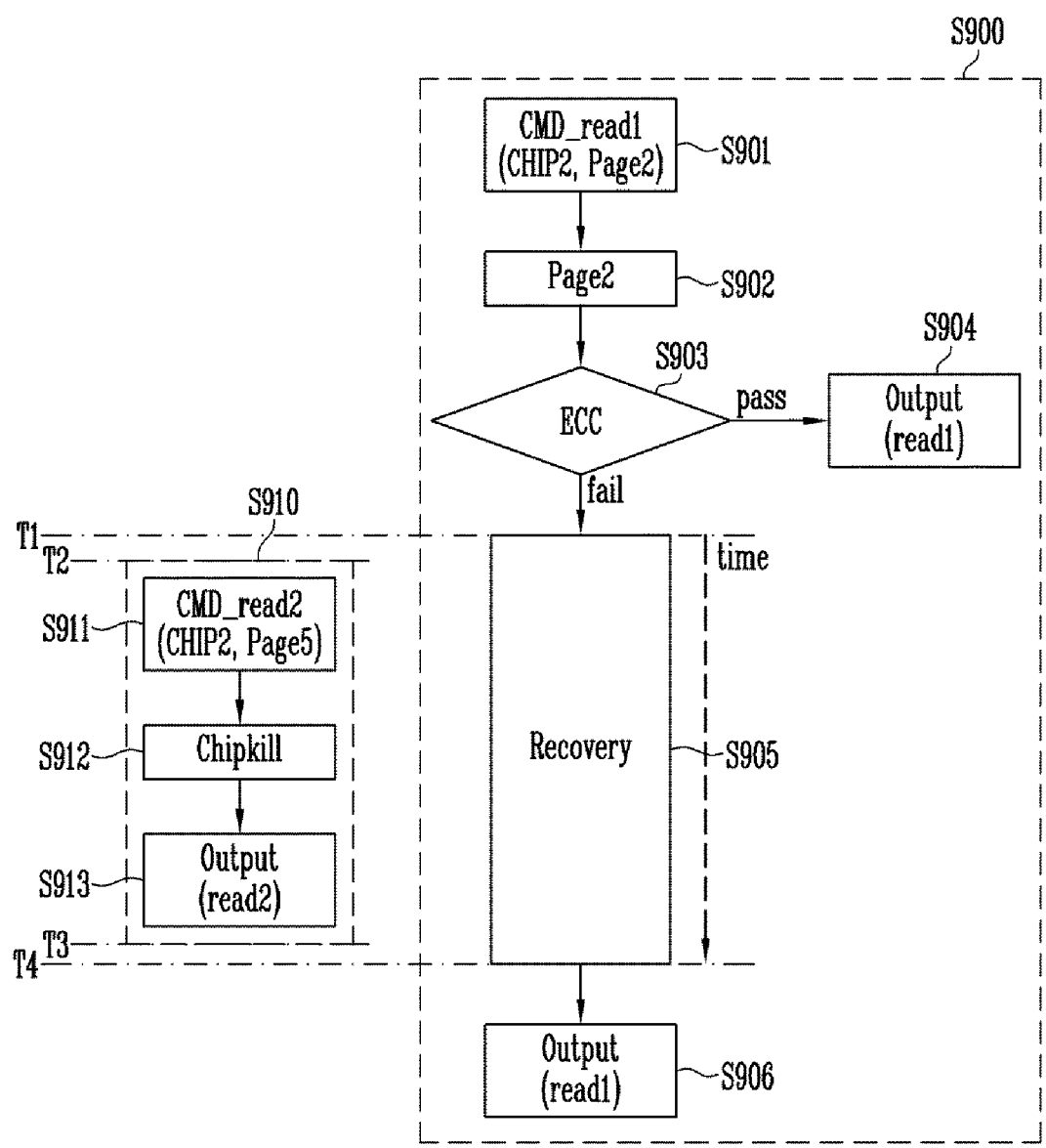
FIG. 9 is a flowchart illustrating an example of an operation method according to an embodiment of the present disclosure.

FIG. 9 is a flowchart illustrating an example of an operation method according to an embodiment of the present disclosure.

Referring to FIG. 9, after a first read operation (S900) is started, when a read command for a second read operation (S910) is received to the memory controller (1200 of FIG. 2) in a state in which the first read operation (S900) is not completed, the second read operation (S910) may be performed using the chipkill, as described in detail below.

If a command for the first read operation is input to the memory controller 1200, the memory controller 1200 may generate a first read command CMD_read1 and a physical address, and transmit the first read command CMD_read1 and the physical address to a selected memory chip according to the physical address (S901). In the example in FIG. 9, it is assumed that the second page Page2 of the second memory chip CHIP2 is a physical address of the first read operation (S901).

The second memory chip CHIP2 may perform a read operation of the selected second page Page2 in response to the first read command and the physical address (S902).

Subsequently, an ECC operation may be performed on data read from the second page Page2 of the second memory chip CHIP2 as part of the execution of the first read command (S903). The ECC operation may be performed by the ECC circuit 230 of FIG. 2 of the memory controller 1200. If the ECC operation passes, the second memory chip CHIP2 may output read data read1 from the first read operation (S904), and therefore, the first read operation (S900) may be ended.

If the ECC operation (S903) for the first read operation fails, the second memory chip CHIP2 may perform a recovery operation (e.g., error correction operation) on the second page Page2 (S905). If the recovery operation (S905) is started at time T1, the memory controller 1200 may transmit codes for a plurality of read voltages to the second memory chip CHIP2, and the second memory chip CHIP2 may repeat read operation using the transmitted codes until the ECC operation passes at a later time T4. In operation, the time duration from T1 to T4 required to perform the recovery operation (S905) may be long.

Typically, in various implementations, if a new read command for a selected memory chip is generated while a read operation and a recovery operation (e.g., error correction operation) is being performed in the same memory chip, the read operation for the new read command may be placed in a waiting state until a previous read operation is completed.

However, in this embodiment in FIG. 9, the second read operation (S910) may be performed on the same memory chip but at another page (e.g., the fifth page) of the second memory chip CHIP2 while the recovery operation (S905) is being performed in the second memory chip CHIP2 (T1 to T4). Those two operations can be executed in parallel and thus the overall operation speed can be increased. The second read operation 910 is described in detail as follows.

The memory controller 1200 may generate a second read command CMD_read2 and a physical address (S911). If it is determined that the first read operation (S900) of the selected second memory chip CHIP2 is still being performed, the memory controller 1200 does not transmit the second read command CMD_read2 and the physical address to the second memory chip CHIP2, and may instead perform a recovery operation for reading the same data from other memory chips without waiting. This process is indicated by step S912 and is labeled as chipkill operation (S912) in FIG. 9.

For example, since the first read operation (S900) is being performed in the second memory chip CHIP2, the other unselected memory chips may be accessed. Therefore, the memory controller 1200 may transmit a read command and a physical address to the unselected memory chips, and obtain second data read2 of the selected fifth page Page5 of the second memory chip CHIP2 by performing an operation on data received from the unselected memory chips and a parity stored in the chipkill memory 240 in FIG. 2. Subsequently, the memory controller 1200 output the read second data read2 (S913). Since read operations of the unselected memory chips are performed in parallel, the time (T2 to T3) required to perform the chipkill operation (S912) may be shorter than that (T1 to T4) required to perform the recovery operation (S905) of the first read operation (S900).

If the recovery operation (S905) of the first read operation (S900) is completed, the second memory chip CHIP2 may output the first data read1 (S906).

As described above, the first read operation (S900) and the second read operation (S910) on the same memory chip can be performed in parallel, so that it is possible to reduce the time required to perform a read operation in the memory system 1000. Therefore, the disclosed read operations based on recovery can be used to perform a fast read operation for reading data from a selected memory chip without accessing the selected memory chip and can do so without need to first encounter a failure in the ECC operation at the selected memory chip.

In this regard, the disclosed technology can be implemented to operate a memory system having a plurality of memory chips to carry out parallel operations in connection with the same memory chip. This operation can include, for example, performing a first operation on a first memory chip over a first operation period, and, during the first operation period while the first operation is in progress, performing a second operation for retrieving data from the first memory chip without directly performing a read operation on the first memory chip and without interrupting the first operation on the first memory chip that is in progress. The second operation for retrieving data from the first memory chip includes reading out pages of other memory chips without reading the selected memory chip, and processing data read from the pages of the other memory chips and a parity for the pages of the other memory chips and the first memory chip to construct data in the first memory chip as retrieved data from the first memory chip.

Figure 10:
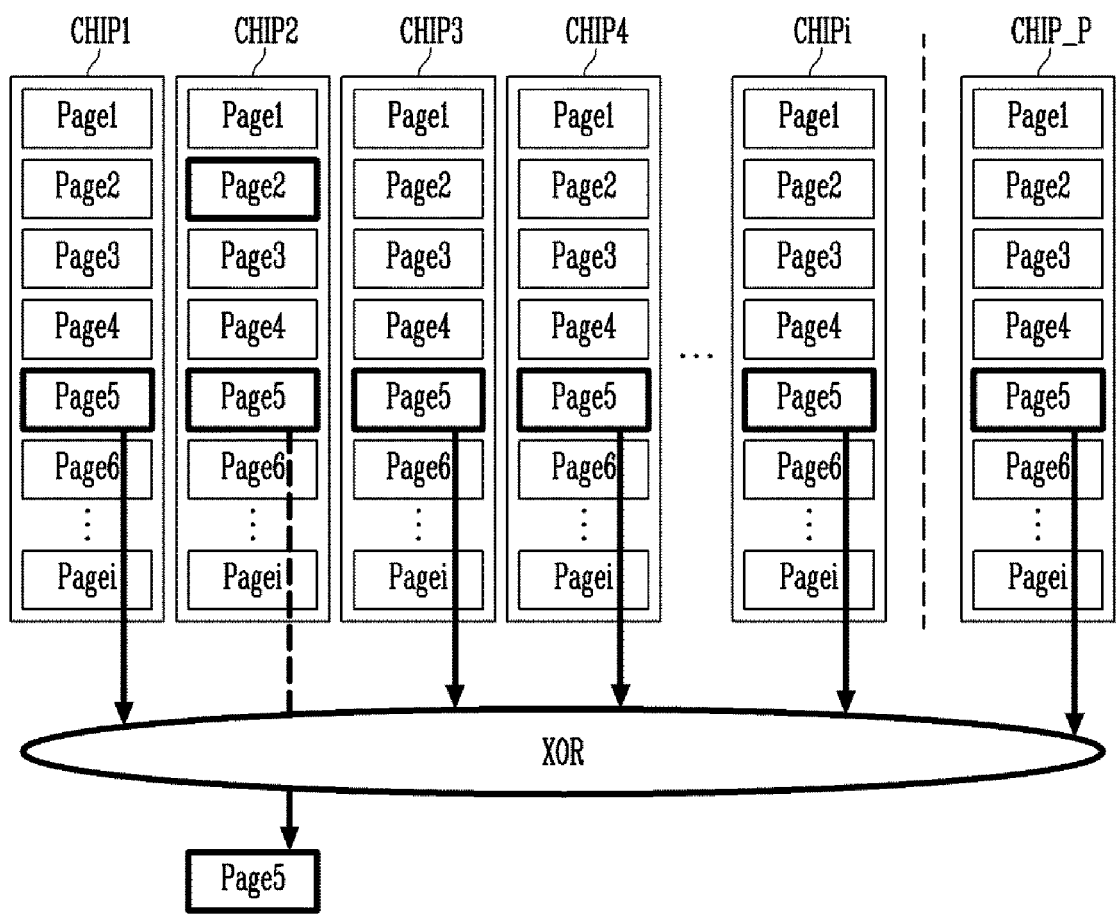
FIG. 10 is a diagram illustrating an example of a second read operation of FIG. 9.

FIG. 10 is a diagram illustrating an example of the second read operation of FIG. 9.

Referring to FIG. 10, since the first read operation on the second page Page2 of the second memory chip CHIP2 is being performed, the second read operation cannot access the second memory chip CHIP2. Thus, the memory controller (1200 of FIG. 2) does not access the second memory chip CHIP2 to perform the second read operation. Instead, the memory controller 1200 reads the fifth pages Page5 of the other unselected memory chips CHIP1 and CHIP3 to CHIPi, and an XOR operation is performed on the read data and a parity for the corresponding pages, thereby obtaining data of the fifth page Page5 of the second memory chip CHIP2.

The features in FIGS. 9 and 10 can used to construct a memory system that includes memory chips including a plurality of pages to store data, a memory controller in communication with the memory chips to access the pages, and memory for storing one or more instructions in this system can be configured to be executed by the memory controller. The instructions include instructions for issuing a read command to a selected memory chip, instructions for determining whether there is an unexecuted command to be executed on the selected memory chip or a command being executed on the selected memory chip, and instructions for restoring data that would have been read out from the selected memory chip by performing a logic operation on data and a parity for the pages in different memory chips when there is an unexecuted command to be executed on the selected memory chip or a command being executed on the selected memory chip.

The above techniques of using recovery to perform a read operation for retrieving data from a selected memory chip by reconstructing the same data from other memory chips without first accessing the selected memory cell or without first encountering an ECC failure can be applied in various memory systems. FIGS. 11-14 provide some examples of memory systems.

Figure 11:
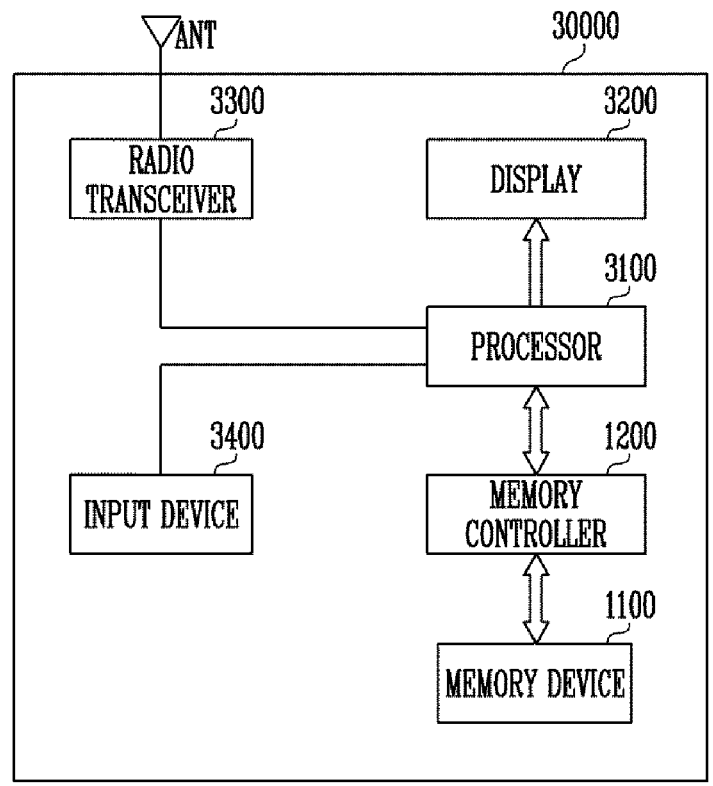
FIG. 11 is a diagram illustrating an example of another embodiment of the memory system including the memory controller shown in FIG. 2.

FIG. 11 is a diagram illustrating another embodiment of the memory system including the memory controller shown in FIG. 2.

Referring to FIG. 11, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the semiconductor memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. In addition, the memory controller 1200 may be implemented as an example of the memory controller shown in FIG. 2.

Figure 12:
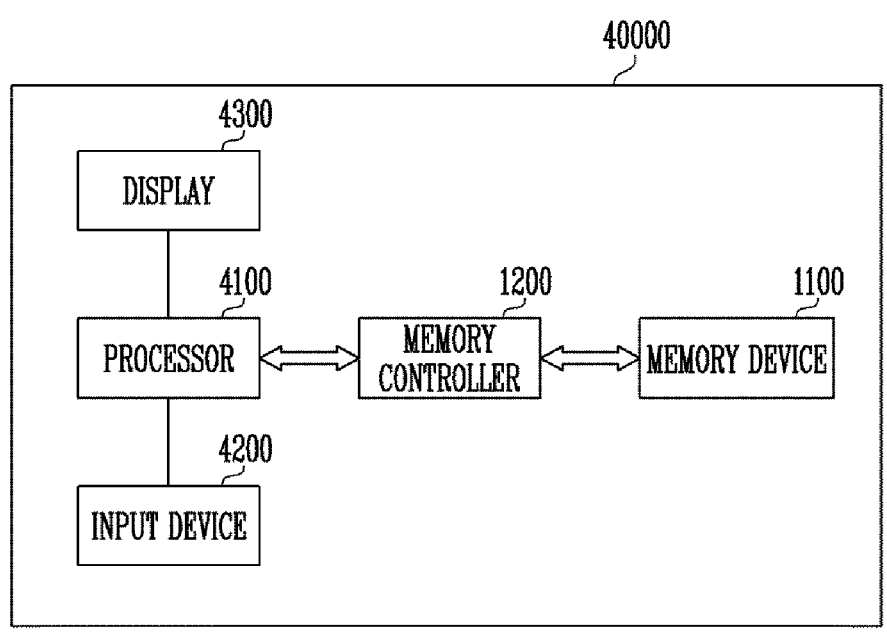
FIG. 12 is a diagram illustrating an example of another embodiment of the memory system including the memory controller shown in FIG. 2.

FIG. 12 is a diagram illustrating another embodiment of the memory system including the memory controller shown in FIG. 2.

Referring to FIG. 12, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. In addition, the memory controller 1200 may be implemented as an example of the memory controller shown in FIG. 2.

Figure 13:
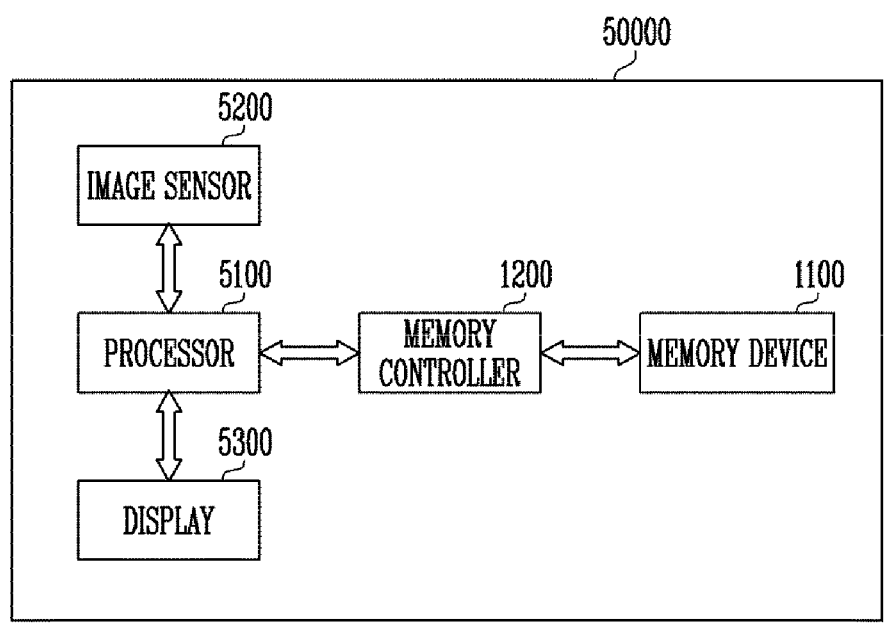
FIG. 13 is a diagram illustrating an example of another embodiment of the memory system including the memory controller shown in FIG. 2.

FIG. 13 is a diagram illustrating an example of another embodiment of a memory system 50000 including the memory controller 1200 shown in FIG. 2.

Referring to FIG. 13, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 may be configured to be capable of controlling an operation of the memory device 1100 and may be implemented as a part of the processor 5100, or as a chip separate from the processor 5100. In addition, the memory controller 1200 may be implemented as an example of the memory controller shown in FIG. 2.

Figure 14:
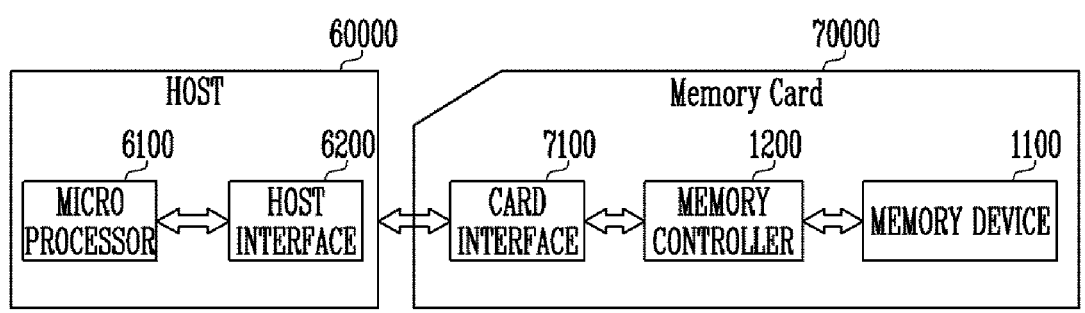
FIG. 14 is a diagram illustrating an example of another embodiment of the memory system including the memory controller shown in FIG. 2.

FIG. 14 is a diagram illustrating an example of another embodiment of the memory system 70000 including the memory controller 1200 shown in FIG. 2.

Referring to FIG. 14, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the card interface 7100 in the present disclosure is not limited thereto and can be implemented in other suitable forms. In addition, the memory controller 1200 may be implemented as an example of the memory controller shown in FIG. 2.

The card interface 7100 may interface data exchange between a host 60000 and the memory controller 1200 according to a protocol of the host 60000. In some embodiments, the card interface 7100 may support a universal serial bus (USB) protocol and/or an inter-chip (IC)-USB protocol. Here, the card interface 7100 may include hardware capable of supporting a protocol used by the host 60000, software embedded in the hardware, or a signal transmission scheme.

When the memory system 70000 is coupled to a host interface 6200 of the host 60000 such as a PC, a portable digital device, a tablet PC, a digital camera, a digital audio player, a digital multimedia player, a television, wireless communication device, a cellular phone, console video game hardware, or a digital set-top box, the host interface 6200 may perform data communication with the memory device 1100 through the card interface 7100 and the memory controller 1200 under the control of a microprocessor 6100.

When implementing the technology disclosed in the present disclosure, if a new read command for another address is input while a recovery operation (e.g., error correction operation) of a previous read operation is being performed, a read operation for the new read command can be performed before the recovery operation of the previous read operation is completed.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is:

1. A memory system comprising:
   memory chips including a plurality of pages to store data; and
   a memory controller in communication with the memory chips to access the pages and configured to execute an error recovery operation on a fail page included in a selected memory chip among the memory chips and to perform a chipkill operation on a next page included in the selected memory chip by performing read operations on pages of unselected memory chips other than the selected memory chip among the memory chips, and performing an operation on read data of the pages of the unselected memory chips and a parity for the pages included in the memory chips,
   wherein a read operation on the fail page is performed before the read operations on the pages of the unselected memory ships, and
   wherein the chipkill operation is performed in parallel with the error recovery operation on the fail page included in the selected memory chip.

2. The memory system of claim 1, wherein the memory chips include a plurality of memory blocks,
   wherein each of the memory blocks includes the plurality of pages.

3. The memory system of claim 1, wherein the parity is a value generated by performing an operation on data of one page included in each of the memory chips.

4. The memory system of claim 1, wherein the memory controller includes:
   a designated memory configured to store the parity; and
   a processor unit configured to generate a read command and perform the operation.

5. The memory system of claim 4, wherein the designated memory stores the parity corresponding to the number of pages included in one memory chip.

6. The memory system of claim 5, wherein the designated memory generates the parity by performing an operation on data of pages included in each of the memory chips.

7. The memory system of claim 4, wherein the processor unit generates the parity by performing an XOR operation, and obtains data of a page of the selected memory chip by performing the XOR operation.

8. A method for operating a memory system having a plurality of memory chips, the method comprising:
   performing read operations on pages of unselected memory chips other than a selected memory chip among the plurality of memory chips; and
   reconstructing data of a selected page of the selected memory chip by performing an operation on data read from the unselected memory chips and a parity for the pages of the unselected memory chips and the selected memory chip,
   wherein reconstructing the data of the selected page of the selected memory chip is performed in parallel with an error recovery operation on a fail page included in the selected memory chip, and
   wherein a read operation on the fail page is performed before the read operations on the pages of the unselected memory chips.

9. The method of claim 8, wherein the parity is generated by performing an XOR operation on data of the memory chips.

10. The method of claim 8, wherein, in the performing of the read operations on the pages of the unselected memory chips, pages corresponding to a group of pages including the selected page are read.

11. The method of claim 8, wherein the obtaining of the data of the selected page is performed by performing an XOR operation on data read from the unselected memory chips and the parity.

12. A method for operating a memory system, the method comprising:
   generating a parity for each of different groups of pages included in memory chips in the memory system;
   performing a first read operation on a first page included in a first memory chip in response to a first read command;
   performing a recovery operation on the first page using an error correction code (ECC) operation of the first read operation; and
   in response to a second read command for reading a second page of the first memory chip while the recovery operation is being performed at the first memory chip, reading data of second pages of the other memory chips except the first memory chip, and reconstructing data of the second page of the first memory chip by performing an operation on the read data of second pages of the other memory chips except the first memory chip and a parity corresponding to the second page of the first memory chip,
   wherein the second read command for reading the second page is executed in parallel with the recovery operation of the first page.

13. The method of claim 12, wherein the parity is generated by performing an XOR operation on data of the pages included in the group of the memory chips.

14. The method of claim 12, wherein the performing of the second read operation includes:
   simultaneously performing a read operation on the second pages of the other memory chips except the first memory chip; and
   performing an XOR operation on the data read from the other memory chips and the parity corresponding to the second page.

15. The method of claim 12, wherein the recovery operation is performed by repeating a read operation on the first memory chip, using various read voltages, until the ECC operation passes.

16. A memory system comprising:
   memory chips including a plurality of pages to store data;
   a memory controller in communication with the memory chips to access the pages; and
   memory for storing one or more instructions configured to be executed by the memory controller, including:
      instructions for issuing a read command to a selected memory chip;
      instructions for determining whether there is an unexecuted command to be executed on the selected memory chip or a command being executed on the selected memory chip; and
      instructions for restoring data that would have been read out from the selected memory chip by performing a logic operation on data and a parity for the pages in different memory chips when there is an unexecuted command to be executed on the selected memory chip or a command being executed on the selected memory chip,
   wherein restoring the data is performed in parallel with the execution of the unexecuted command or the command being executed.

17. The memory system of claim 16, wherein the different memory chips include a memory chip designated for storing the parity.

18. The memory system of claim 16, wherein the unexecuted command to be executed on the selected memory chip and the command being executed on the selected memory chip include a recovery operation.

* * * * *